United States Patent
Sako et al.

(10) Patent No.: US 8,957,433 B2
(45) Date of Patent: Feb. 17, 2015

(54) SAPPHIRE SUBSTRATE AND METHOD FOR MANUFACTURING THE SAME AND NITRIDE SEMICONDUCTOR LIGHT EMITTING ELEMENT

(71) Applicants: Naoya Sako, Anan (JP); Takashi Ohara, Anan (JP); Yoshiki Inoue, Anan (JP); Yuki Shibutani, Anan (JP); Yoshihito Kawauchi, Komatsushima (JP); Kazuyuki Takeichi, Komatsushima (JP); Yasunori Nagahama, Naruto (JP)

(72) Inventors: Naoya Sako, Anan (JP); Takashi Ohara, Anan (JP); Yoshiki Inoue, Anan (JP); Yuki Shibutani, Anan (JP); Yoshihito Kawauchi, Komatsushima (JP); Kazuyuki Takeichi, Komatsushima (JP); Yasunori Nagahama, Naruto (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/804,453

(22) Filed: Mar. 14, 2013

(65) Prior Publication Data
US 2014/0061661 A1      Mar. 6, 2014

(30) Foreign Application Priority Data

Mar. 28, 2012 (JP) ................ P2012-074667
Mar. 13, 2013 (JP) ................ P2013-049919

(51) Int. Cl.
*H01L 33/32* (2010.01)
*C30B 25/18* (2006.01)
(Continued)

(52) U.S. Cl.
CPC .............. *H01L 33/32* (2013.01); *C30B 25/186* (2013.01); *C30B 29/20* (2013.01); *C30B 29/403* (2013.01);
(Continued)

(58) Field of Classification Search
CPC ........ H01L 21/308; H01L 33/32; H01L 29/49
USPC ........................................ 257/76–80
See application file for complete search history.

(56) References Cited

U.S. PATENT DOCUMENTS

2003/0057444 A1    3/2003  Niki et al.
2005/0001227 A1    1/2005  Niki et al.
(Continued)

FOREIGN PATENT DOCUMENTS

JP   2003-318441 A   11/2003
JP   2004-031405 A    1/2004
(Continued)

OTHER PUBLICATIONS

European Search Report EP Application No. 13161043.8 dated Jun. 28, 2013.
(Continued)

*Primary Examiner* — Nathan Ha
(74) *Attorney, Agent, or Firm* — Foley & Lardner LLP

(57) ABSTRACT

A sapphire substrate provided with a plurality of projections on a principal surface on which a nitride semiconductor is grown to form a nitride semiconductor light emitting element. The projections have a substantially triangular pyramidal-shape the projections having a plurality of side surfaces and a pointed top. The side surfaces have an inclination angle of between 53° and 59° from a bottom of the projections. The side surfaces are crystal-growth suppressed surfaces on which a growth of the nitride semiconductor is suppressed relative to a portion of the principal surface located between adjacent projections. A bottom of the projections has a substantially triangular shape having three outwardly curved arc-shaped sides, and each of the side surfaces has a substantially triangular shape having vertexes located at the top of the projection and at both ends of a respective side of the bottom of the projection.

8 Claims, 7 Drawing Sheets

(51) Int. Cl.
*C30B 29/20* (2006.01)
*C30B 29/40* (2006.01)
*C30B 33/08* (2006.01)
*C30B 33/10* (2006.01)
*C30B 33/12* (2006.01)
*H01L 21/308* (2006.01)

(52) U.S. Cl.
CPC ............... *C30B 29/406* (2013.01); *C30B 33/08* (2013.01); *C30B 33/10* (2013.01); *C30B 33/12* (2013.01); *H01L 21/308* (2013.01)
USPC .......................................................... 257/95

(56) References Cited

U.S. PATENT DOCUMENTS

| | | |
|---|---|---|
| 2005/0179130 A1 | 8/2005 | Tanaka et al. |
| 2008/0303042 A1 | 12/2008 | Minato et al. |
| 2008/0303043 A1 | 12/2008 | Niki et al. |
| 2009/0042328 A1 | 2/2009 | Niki et al. |
| 2009/0114933 A1 | 5/2009 | Osawa et al. |
| 2010/0197055 A1 | 8/2010 | Tanaka et al. |
| 2010/0255621 A1 | 10/2010 | Minato et al. |
| 2010/0264445 A1 | 10/2010 | Niki et al. |
| 2010/0264446 A1 | 10/2010 | Niki et al. |
| 2010/0264447 A1 | 10/2010 | Niki et al. |
| 2010/0266815 A1 | 10/2010 | Niki et al. |
| 2010/0267181 A1 | 10/2010 | Niki et al. |
| 2011/0012109 A1* | 1/2011 | Kryliouk et al. ................ 257/49 |
| 2011/0168670 A1 | 7/2011 | Wu et al. |
| 2011/0210425 A1 | 9/2011 | Su et al. |
| 2011/0316041 A1 | 12/2011 | Narita et al. |
| 2012/0228656 A1 | 9/2012 | Kamiyama et al. |
| 2013/0256692 A1* | 10/2013 | deVilliers et al. ................ 257/76 |
| 2013/0320353 A1* | 12/2013 | Kryiouk et al. ................ 257/76 |

FOREIGN PATENT DOCUMENTS

| | | |
|---|---|---|
| JP | 2005-101566 A | 4/2005 |
| JP | 2006-332714 A | 12/2006 |
| JP | 2007-273659 A | 10/2007 |
| JP | 2008-177528 A | 7/2008 |
| JP | 2009-283620 A | 12/2009 |
| JP | 2010-114159 A | 5/2010 |
| JP | 2010-206230 A | 9/2010 |
| JP | 4637781 B | 2/2011 |
| JP | 2011-176379 A | 9/2011 |
| WO | WO 2005/018008 A1 | 2/2005 |
| WO | WO 2011/009093 A2 | 1/2011 |
| WO | WO 2012/002240 A1 | 1/2012 |

OTHER PUBLICATIONS

Xiao-Hui Huang et al., "Effect of Patterned Sapphire Substrate Shape on Light Output Power of GaN-Based LEDs", IEEE Photonics Technology Letters, vol. 23, No. 14, Jul. 15, 2011, pp. 944-946.

Ji-Hao Cheng et al., "Improved crystal quality and performance of GaN-based light-emitting diodes by decreasing the slanted angle of patterned sapphire", Applied Physics Letters, 96, 051109-1-051109-3, 2010.

Haiyong Gao et al., "Enhancement of the light output power of InGaN/GaN light-emitting diodes grown on pyramidal patterned sapphire substrates in the micro- and nanoscale", Journal of Applied Physics 103, 014314-1-014314-5, 2008.

* cited by examiner

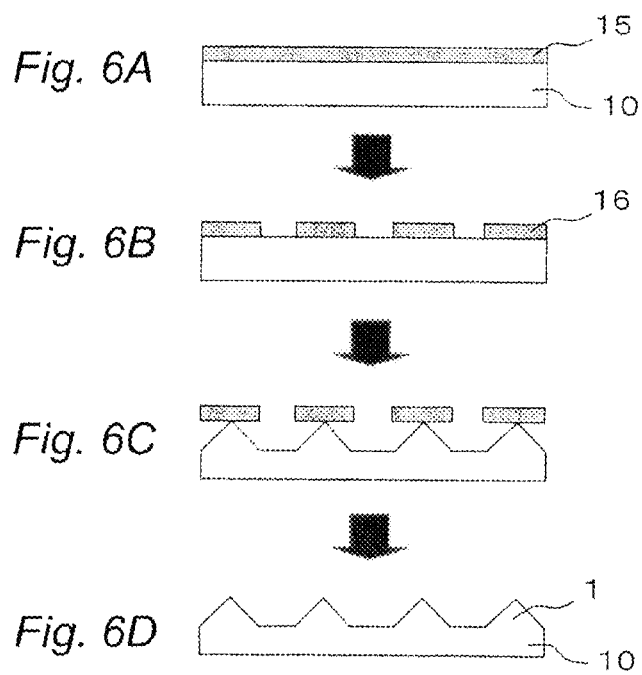
Fig. 6A
Fig. 6B
Fig. 6C
Fig. 6D
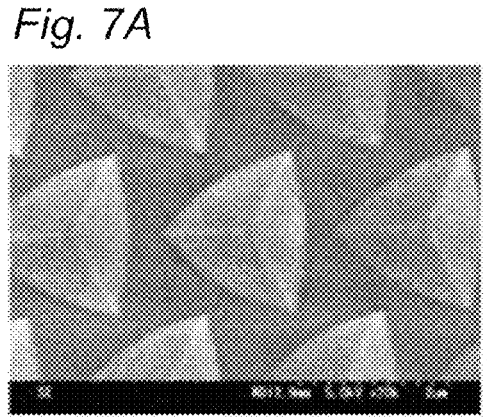
Fig. 7A
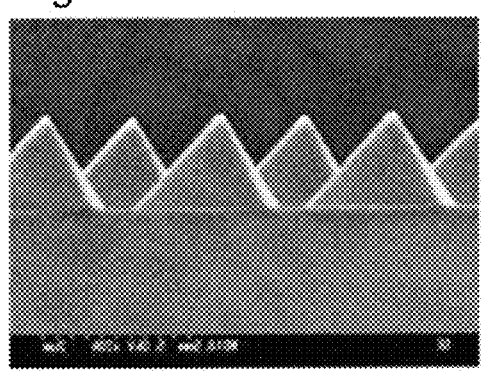
Fig. 7B

SAPPHIRE SUBSTRATE AND METHOD FOR MANUFACTURING THE SAME AND NITRIDE SEMICONDUCTOR LIGHT EMITTING ELEMENT

CROSS REFERENCE TO RELATED APPLICATIONS

The present application claims priority under 35 U.S.C. §119 to Japanese Patent Application No. 2012-074667, filed Mar. 28, 2012, and Japanese Patent Application No. 2013-049919, filed Mar. 13, 2013.

BACKGROUND OF THE INVENTION

1. Field of the Invention

The present Invention relates to a sapphire substrate for a nitride semiconductor light emitting element and a method for manufacturing the same and a nitride semiconductor light emitting element.

2. Description of Related Art

Generally, a light emitting diode (LED) made of a nitride semiconductor is constituted by laminating on a sapphire substrate an n-type semiconductor layer, an active layer and a p-type semiconductor layer in this order. Light generated in this light emitting diode at the active layer is extracted from a side opposite to the sapphire substrate or from the sapphire substrate side, while the generated light is also radiated to a direction opposite to a light exiting side. Therefore, it is necessary to improve external quantum efficiency by allowing light radiated to a direction opposite to the light exiting side to be extracted effectively from the light exiting side.

Therefore, JP 2008-177528A, for example, discloses that an external quantum efficiency of a semiconductor light emitting element is improved by arranging a plurality of projections having truncated triangular pyramidal-shape on a sapphire substrate. It also describes that the generation of voids and the deterioration of crystallinity can be suppressed by growing a nitride semiconductor crystalline on a surface on which truncated triangular pyramidal-shaped projections are formed.

However, with an increase in an output of light emitting diodes, it has been found as a result of the present inventors' studies that problems due to crystal defects become apparent, which were not recognized in the previous light emitting diodes. In addition, further improvements are desired in a light extraction efficiency of light emitting diodes.

Thus, an object of the present invention is to provide a sapphire substrate and a method for manufacturing the same, which enables growth of a nitride semiconductor having excellent crystallinity and can provide a nitride semiconductor light emitting element having excellent light extraction efficiency.

Furthermore, an object of the present invention is to provide a nitride light emitting element which comprises a nitride semiconductor having excellent crystallinity and light extraction efficiency.

SUMMARY OF THE INVENTION

One aspect of the present invention is a sapphire substrate provided with a plurality of projections on a principal surface on which a nitride semiconductor is grown to form a nitride semiconductor light emitting element, wherein the projections have a substantially pyramidal-shape constituted by a plurality of side surfaces to have a pointed top, wherein the side surfaces have an inclined angle of between 53° and 59° from a bottom surface of the projections, and wherein the side surfaces are crystal-growth-suppressed surfaces on which a growth of the nitride semiconductor is suppressed relative to a substrate surface located between the adjacent projections.

Another aspect of the present invention is a method for manufacturing a sapphire substrate in which a plurality of projections are formed on C-plane of the sapphire substrate by etching, comprising: forming a patterned etching mask on C-plane of the sapphire substrate; etching the sapphire substrate until the projections are formed, wherein the projections formed by the etching have a substantially pyramidal-shape constituted by a plurality of side surfaces to have a pointed top, the side surfaces having an inclined angle of between 53° and 59° from a bottom surface of the projections; and removing the etching masks from the sapphire substrate.

Further aspect of the present invention is a nitride semiconductor light emitting element formed by growing a nitride semiconductor on the principal surface of the sapphire substrate.

BRIEF DESCRIPTION OF DRAWINGS

FIGS. 6A-6D schematically show the respective steps of a method for manufacturing a sapphire substrate according to one embodiment of the present invention.

FIG. 7A is a SEM image from a top side of a sapphire substrate of Examples, and FIG. 7B is a SEM image at a cross section of the sapphire substrate of Examples.

DESCRIPTION OF EMBODIMENTS

Detailed Description

Hereinafter, embodiments of the present invention are described with reference to the drawings. However, embodiments described below are aimed at embodying the present invention, and the present invention is not limited to the embodiments. In particular, dimensions, materials, shapes relative arrangement and the like of the components described below are not intended to limit the scope of the present invention only to them unless specifically described, but they are merely illustrative explanations. In addition, dimensions, positional relations and the like of members shown in each drawing may be exaggerated in order to make explanations clear. Furthermore, each component constituting embodiments of the present invention may be adapted to an aspect in which a plurality of components are constituted by the same member and the plurality of components are combined into one member, or on the contrary, can be achieved by sharing a function of one member with a plurality of members.

Figure 1A:
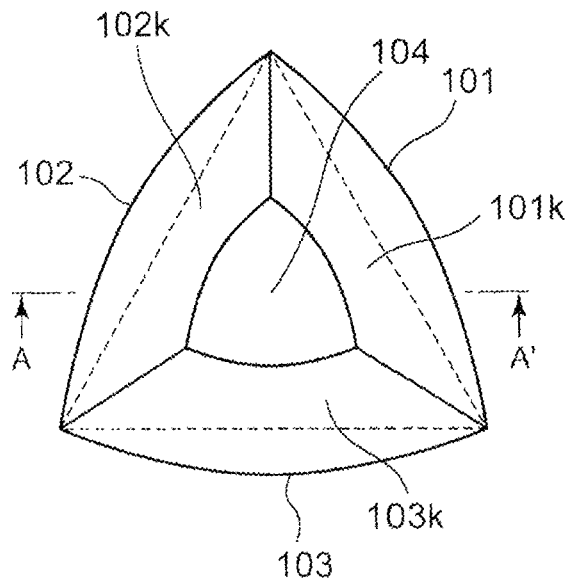
FIG. 1A shows a plan view of an example of a previous projection.
Figure 1B:
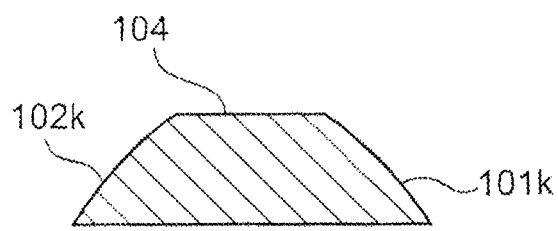
FIG. 1B shows a cross-section view of the projection shown in FIG. 1B along the line A-A'.

FIGS. 1A and 1B show an example of previous projections (see JP 2008-177528A). The projections shown in FIGS. 1A and 1B have a substantially truncated triangular pyramidal-shape with a bottom surface having substantially triangular shape, and have a flat surface 104 at the top of the projection parallel to a plane positioned between the adjacent projections. Each of the sides 101, 102 and 103 has an outwardly curved arc shape, respectively. The flat surface 104 at the top is a crystal growth surface on which a nitride semiconductor can be grown. On the other hand, three side surfaces 101k, 102k and 103k are crystal-growth-suppressed surfaces on which the growth of nitride semiconductor is suppressed, respectively. Using a sapphire substrate having such projections periodically arranged thereon, a nitride semiconductor having excellent crystallinity can be grown and a nitride semiconductor light emitting element having excellent light extraction efficiency can be obtained.

The sapphire substrate having the above-mentioned previous projections periodically arranged thereon can further improve the light extraction efficiency by increasing the heights of the projections. However, it has been found as a result of the present inventors' studies that voids are likely to be generated in the nitride semiconductor grown on the substrate when the heights of the previous projections are increased.

The present inventors have intensively studied and found that both improved light extraction efficiency and excellent crystallinity can be achieved by using a sapphire substrate having a plurality of substantially pyramidal-shaped projections constituted by side surfaces that are inclined from bottom surfaces of the projections by 53° to 59° to have a pointed top, and thus, the embodiment has been completed.

The embodiment relates to a sapphire substrate provided with a plurality of projections on a principal surface on which a nitride semiconductor is grown to form a nitride semiconductor light emitting element, wherein the projections have a substantially pyramidal-shape constituted by a plurality of side surfaces to have a pointed top, wherein the side surfaces have an inclined angle of between 53° and 59° from a bottom surface of the projections, and wherein the side surfaces are crystal-growth-suppressed surface on which a growth of the nitride semiconductor is suppressed relative to the substrate surface located between the adjacent projections.

The bottom surface of the projections preferably has a substantially polygonal shape having three or more outwardly curved arc-shaped sides, respectively, and each of the side surfaces preferably has a substantially triangular shape of which vertexes are both ends of a side of the bottom surface and the top of the projection. The bottom surface of the projection more preferably has substantially triangular shape.

The projections preferably have a height of between 1.0 and 1.7 µm.

The projections are preferably arranged to be apart from each other on the principal surface of the sapphire substrate. Further, the projections are preferably arranged periodically on the principal surface of the sapphire substrate, and more preferably arranged on each vertex of triangular, tetragonal or hexagonal lattice.

A distance between tops of the adjacent projections is preferably between 2.2 µm and 3.1 µm, more preferably between 2.8 µm and 3.1 µm.

The substrate surface located between the adjacent projections a crystal growth surface, and a ratio of an area of the crystal growth surface to that of the principal surface is preferably between 25% and 60%, and more preferably between 30% and 45%.

Furthermore, the embodiment relates to a method for manufacturing a sapphire substrate in which a plurality of projections are formed on C-plane of the sapphire substrate by etching, comprising: forming a patterned etching mask on C-plane of the sapphire substrate; and etching the sapphire substrate until the projections are formed, wherein the projections formed by the etching have a substantially pyramidal-shape constituted by a plurality of side surfaces to have a pointed top, the side surfaces having an inclined angle of between 53° and 59° from a bottom surface of the projections.

Furthermore, the embodiment relates to a nitride semiconductor light emitting element formed by growing a nitride semiconductor on the principal surface of any of the above-mentioned sapphire substrate.

With the sapphire substrate of the embodiment, a nitride semiconductor having excellent crystallinity can be grown, and a nitride semiconductor light emitting element having excellent light extraction efficiency, in particular light extraction efficiency from the side opposite to the sapphire substrate and from the direction perpendicular to the substrate can be obtained.

In addition, the method for manufacturing the sapphire substrate of the embodiment can provide a sapphire substrate on which a nitride semiconductor having excellent crystallinity can be grown, and by using the sapphire substrate, a nitride semiconductor light emitting element having excellent light extraction efficiency, in particular light extraction efficiency from the side opposite to the sapphire substrate and from the direction perpendicular to the substrate can be obtained.

Furthermore, the nitride semiconductor light emitting element of the embodiment has the above-mentioned features and thus, consists of nitride semiconductor having excellent crystallinity and has excellent light extraction efficiency, in particular light extraction efficiency from the side opposite to the sapphire substrate and from the direction perpendicular to the substrate.

[Sapphire Substrate]

Figure 2:
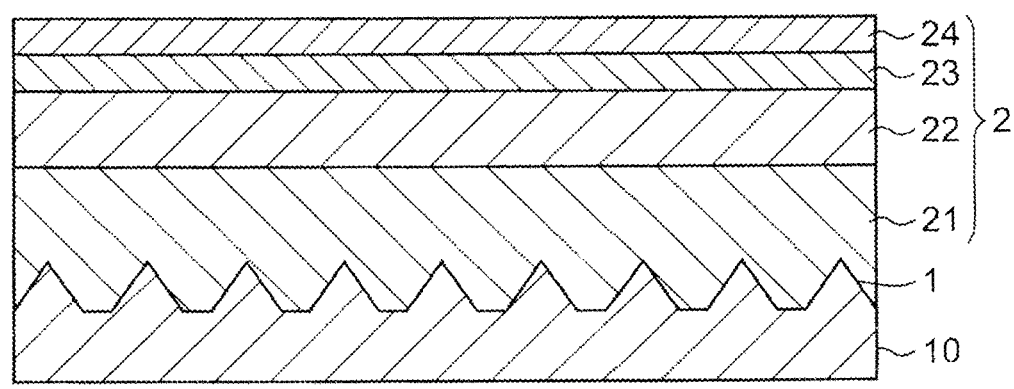
FIG. 2 is a cross-section view of a nitride semiconductor light emitting element in an embodiment of the present invention.

FIG. 2 shows a cross section of a nitride semiconductor light emitting element in one embodiment of the present invention. In FIG. 2, a semiconductor laminated structure 2 in which a base layer 21, a first conductive layer (n-type layer) 22, an active layer (light emitting layer) 23, a second conductive layer (p-type layer) 24 are laminated in this order is formed on a sapphire substrate 10, and a plurality of projections having substantially pyramidal-shape with a pointed top, respectively, are formed on the surface of the substrate 10 on which the base layer 21 is grown.

The sapphire substrate of embodiments of the present invention is provided with a plurality of projections on one principal surface, wherein the projection has substantially a pyramidal-shape having a pointed top and constituted by a plurality of side surfaces, wherein the side surface has an inclined angle of between 53° and 59° from a bottom surface of the projection, and wherein the side surface is a crystal-growth-suppressed surface on which growth of nitride semiconductor is suppressed relative to the substrate surface located between the adjacent projections.

In the present specification, "pointed top" means that there is substantially no surface parallel to the substrate surface located between the adjacent projections, or the surface on the top of the projection parallel to the substrate surface located between the adjacent projections is small enough not to allow a growth of nitride semiconductor from the top of the projection.

In the present specification, "substantially pyramidal-shape" means a shape approximated by pyramidal-shape. Similarly, "substantially triangular pyramidal-shape", "substantially polygonal shape", "substantially triangular shape" and "substantially truncated triangular pyramidal-shape" mean shapes approximated by triangular pyramidal-shape, polygonal shape, triangular shape and truncated triangular pyramidal-shape, respectively. In particular, "substantially pyramidal-shape (substantially triangular pyramidal-shape)" includes, for example, a shape in which each side of the bottom surface of the pyramidal-shape (triangular pyramid) has an outwardly curved arc shape and each side surface is an outwardly curved rounded surface; a shape in which each side of the bottom surface of the pyramidal-shape (triangular pyramid) is a straight line and each side surface is flat; and a shape in which each side of the bottom surface of the pyramidal-shape (triangular pyramid) has an inwardly curved arc shape and each side surface is an inwardly curved rounded surface. In addition, "substantially polygonal shape (substantially triangular shape" includes, for example, a shape in which each side of the polygonal shape (triangular shape) has an outwardly curved arc shape, a shape in which each side of the polygonal shape (triangular shape) is a straight line, and a shape in which each side of the polygonal shape (triangular shape) has an inwardly curved arc shape.

Since the side surfaces constituting the projection have large inclined angles of between 53° and 59° from the substrate surface located between the adjacent projections, light propagating in the nitride semiconductor light emitting element can be effectively reflected and/or diffracted on the side surfaces of the projections and in particular, can be reflected to a side opposite to the sapphire substrate in the direction perpendicular to the substrate. As a result, the light extraction efficiency especially from the side opposite to the sapphire substrate and from the direction perpendicular to the substrate can be improved.

Moreover, the sapphire substrate of embodiments of the present invention can achieve further improved light extraction efficiency by increasing the height of the projections, and at the same time, it can achieve the growth of the nitride semiconductor having excellent crystallinity even if the height of the projections are increased.

Hereinafter, it is described a mechanism how the nitride semiconductor having excellent crystallinity can be grown. In the sapphire substrate of embodiments of the present invention, each of the side surfaces constituting the projection formed on the substrate is the crystal-growth-suppressed surface on which the growth of the nitride semiconductor is suppressed. On the other hand, the substrate surface located between the adjacent projections is for example, C-plane, and is the crystal growth surface on which the nitride semiconductor can be grown. When the nitride semiconductor is grown from the crystal growth surface to the longitudinal direction (the direction perpendicular to the sapphire substrate), crystal defects (dislocations) due to the difference between a lattice constant of the substrate and that of the nitride semiconductor tend to extend to the growth direction and generate on the surface. When the nitride semiconductor is grown on the sapphire substrate of embodiments of the present invention, the nitride semiconductor is grown from the crystal growth surface located between the projections; however, the growth from the side surface of the projection is suppressed, and the nitride semiconductor is not substantially grown. Therefore, the nitride semiconductor grown from the crystal growth surface between the projections is grown to the lateral direction on the side surface of the projection, and as the growth proceeds, the nitride semiconductor gets to cover the projections 1. This crystal growth to the lateral direction causes the crystal defects extending to the growth direction to be trapped within the nitride semiconductor, and as a result, crystal defects generated on the surface of the nitride semiconductor can be reduced. A light emitting element structure formed by laminating the nitride semiconductor layer having reduced crystal defects can be obtained by further laminating the nitride semiconductor layer on the surface of this flat nitride semiconductor having reduced crystal defects.

Figure 3A:
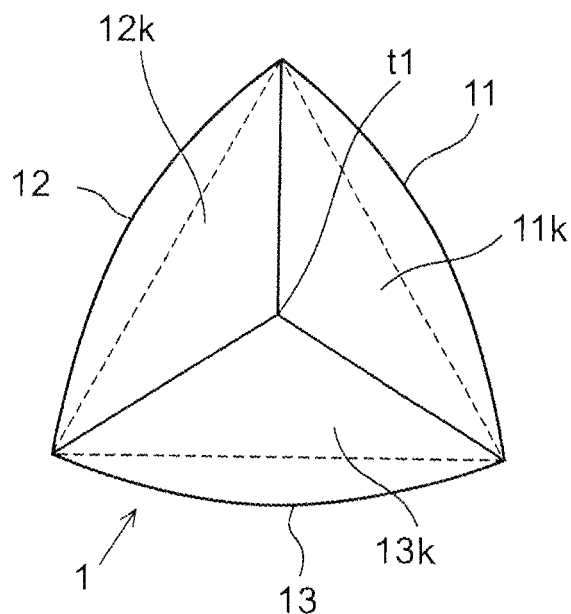
FIG. 3A is a plan view of a projection in an embodiment of the present invention.
Figure 3B:
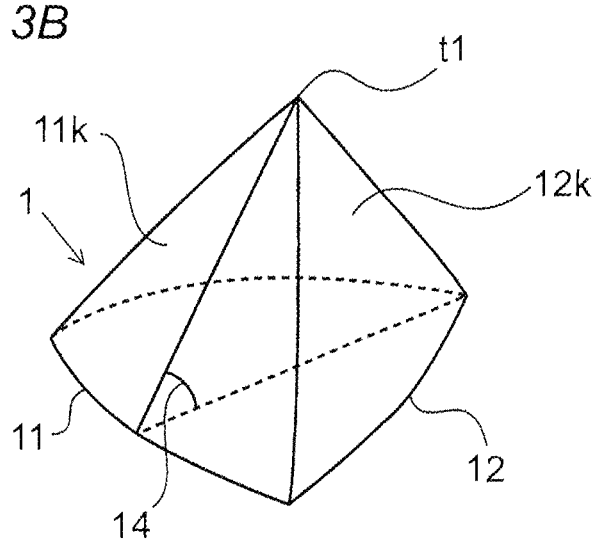
FIG. 3B shows a perspective view of the projection shown in FIG. 3A.

As illustrated in FIGS. 3A and 3B described below, the projection with respect to embodiments of the present invention has substantially pyramidal-shape with a pointed top, and has no crystal growth surface on the top of the projection unlike the previous projection shown in FIGS. 1A and 1B. Since the previous projection shown in FIGS. 1A and 1B has a crystal growth surface on the top of the projection, the growth of the nitride semiconductor in lateral direction as described above tends to be impeded by the growth in longitudinal direction from the top of the projection when the height of the projection is increased. On the other hand, the projection with respect to embodiments of the present invention exhibit high effect of reducing crystal defects generated at the surface of the nitride semiconductor since the growth of the nitride semiconductor in lateral direction is not impeded by the growth in longitudinal direction from the top of the projection even if the height of the projection is increased.

Furthermore, the projection according to embodiments of the present invention can be arranged densely on the sapphire substrate because the projections have substantially pyramidal-shape with a pointed top and the inclined angles of the side surfaces constituting the projection being between 53 and 59°. In case the inclined angles of the side surfaces are smaller, the height of the projections must be decreased if the projections are intended to be arranged densely. Embodiments of the present invention enable high-density arrangement of the projections having its increased height on the sapphire substrate by increasing the inclined angles of the side surfaces constituting the projections. A ratio of the nitride semiconductor laterally growing so as to cover the crystal-growth-suppressed surface is increased since the area ratio of the crystal-growth-suppressed surface to the crystal growth surface is increased by arranging the projections densely, and crystal defects extending in the growth direction are trapped within the nitride semiconductor, and as a result, the crystal defects appearing on the surface can be decreased. In addition, the sapphire substrate of embodiments of the present invention can reduce a diffusion of incoming light by arranging the projections densely thereon, and the light extraction efficiency of the obtained nitride semiconductor light emitting element can be improved.

The bottom surface of the projection preferably has substantially polygonal shape having three or more sides which are outwardly curved arc-shaped, respectively, and the side surfaces preferably have substantially triangular shape of which vertexes are both ends of a side of the bottom surface and the top of the projection, respectively. More preferably, the bottom surface of the projection has substantially triangular shape. In particular, the side surfaces of the projections are preferably outwardly curved rounded surfaces.

FIGS. 3A and 3B show a projection according to one embodiment of the present invention. In this embodiment, the projection 1 has substantially triangular pyramidal-shape and its top t1 is pointed. The projection 1 is formed so as to have substantially triangular pyramidal-shape constituted by three side surfaces 11k, 12k and 13k. The bottom surface of the projection has substantially triangular shape having sides 11, 12 and 13 having outwardly curved arc-shape, and the side surfaces 11k, 12k and 3k are outwardly curved substantially triangular-shaped rounded surfaces, respectively. The three side surfaces 11k, 12k and 13k of the projection 1 have the inclined angle of between 53~59° from the substrate surface located between the adjacent projections, respectively. The inclined angle 14 of the side surface 11k is shown in FIG. 3 (b) by way of example. As can be seen from FIG. 3B, the "inclined angle" of the side surfaces of the projections means in the present specification, an angle between the bottom surface of the projection and a line connecting the top t1 of the projection with a center of a side 11, 12 or 13 of the bottom surface of the projection.

As can be seen from FIG. 7B described below, the inclined angle of the projections according to embodiments of the present invention is substantially constant at any point on the line connecting the top of the projection with a center of a side of the bottom surface of the projection. In other words, the side surfaces of the projections are substantially flat in a cross section passing through the top of the projection and any of the centers of the sides of the bottom surface.

The height of the projections is preferably between 1.0 and 1.7 µm. The nitride semiconductor light emitting element exhibiting excellent light extraction efficiency can be obtained by setting the height of the projections in this manner. In the present specification, "height of projection" means a distance between the top of the projection and the bottom surface of the projection.

The side surfaces constituting the projection are crystal-growth-suppressed surfaces on which the crystal growth is suppressed compared to the crystal growth surface. The crystal-growth-suppressed surfaces provided on the sapphire substrate facilitate lateral growth of nitride semiconductor grown from the crystal growth surfaces located on the adjacent projections to allow formation of nitride semiconductor having a surface with reduced crystal defects. Thus, the projections having crystal-growth-suppressed surface(s) are preferably distributed uniformly on the sapphire substrate and arranged to be apart from each other.

Figure 4:
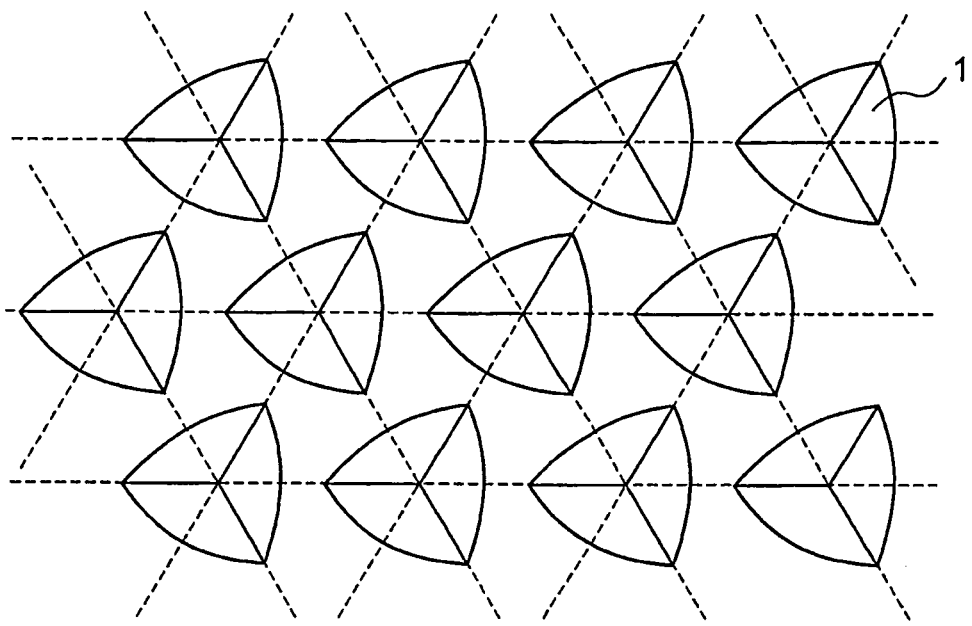
FIG. 4 is a plan view showing an example of projection arrangement in a nitride semiconductor light emitting element of an embodiment.
Figure 5:
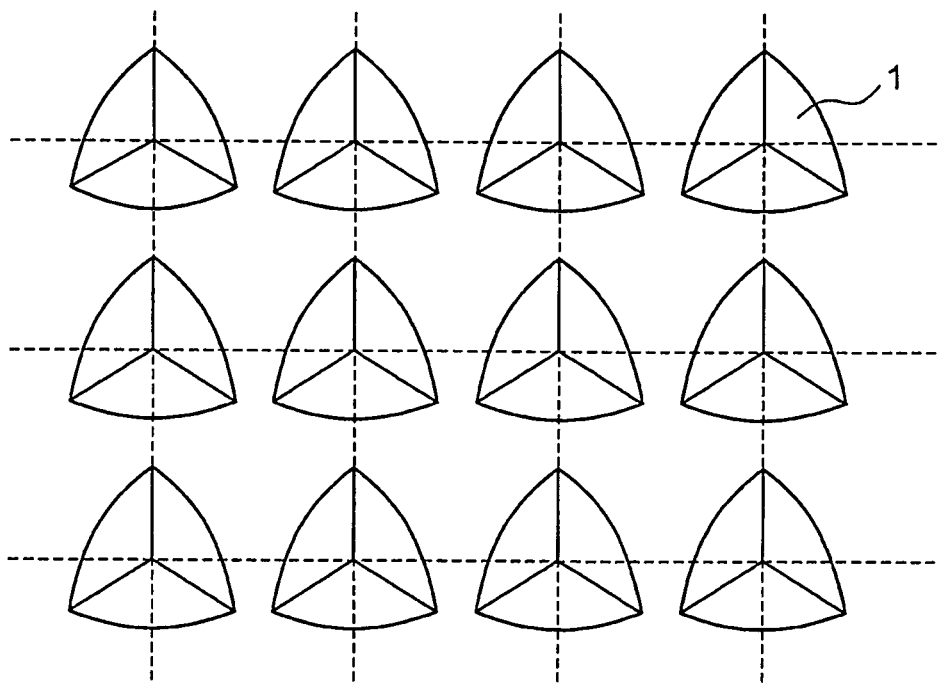
FIG. 5 is a plan view showing another example of projection arrangement in a nitride semiconductor light emitting element of an embodiment.

The projections are more preferably arranged periodically on the sapphire substrate. The projections are preferably arranged on each vertex of triangular, tetragonal or hexagonal lattice. For example, specific arrangement of the projections includes arrangements such as parallelogram lattice-point arrangement and rectangular lattice-point arrangement, other than the triangular lattice-point arrangement shown in FIG. 4 and square lattice-point arrangement shown in FIG. 5. The triangular lattice-point arrangement is particularly preferable since propagation in lateral direction of light generated in light emitting layer can be effectively interrupted especially in case of high-density arrangement. The projections may be formed with the same periodic arrangement on the entire surface of the sapphire substrate, or alternatively may be formed with different periodic arrangements on at least two areas dividing the surface of the sapphire substrate depending on the semiconductor element structure (for example, electrode arrangement) formed on the substrate.

A distance between the tops of the adjacent projections (hereinafter referred to as a distance between the projections) is preferably between 2.2 and 3.1 µm, and more preferably between 2.8 and 3.1 µm. By setting the distance between the projections in this range, the crystallinity of the nitride semiconductor grown on the sapphire substrate as well as the light extraction efficiency of the obtained nitride semiconductor light emitting element are improved.

In the sapphire substrate of embodiments of the present invention, a ratio of an area of the crystal growth surface to that of the principal surface (hereinafter referred to as an area ratio of crystal growth surface) is preferably between 25 and 50%, and more preferably between 30 and 45%. A nitride semiconductor light emitting element exhibiting higher light extraction efficiency can be obtained by setting the area ratio of crystal growth surface in this manner.

[Method for Manufacturing a Sapphire Substrate]

The method for manufacturing the sapphire substrate of embodiments of the present invention is characterized in that the plurality of projections are formed on C-plane of the sapphire substrate by etching, the method comprising an etching process of forming the plurality of etching masks on C-plane of the sapphire substrate and etching the sapphire substrate until the projections become substantially pyramidal-shaped with a pointed top.

Etching includes wet etching and dry etching, and embodiments of the present invention may employ any of the etching process.

As the dry etching, in particular, vapor-phase etching, plasma etching and reactive ion etching can be used, and the etching gas in this regard includes Cl-based and F-based gases such as $Cl_2$, $SiCl_4$, $BCl_3$, $HBr$, $SF_6$, $CHF_3$, $C_4F_8$, $CF_4$, for example, as well as inactive gases such as Ar. The mask material which can be used in dry etching includes oxide layers such as $SiO_2$ or metal layers such as Ni.

As an etching liquid for the wet etching, phosphoric acid or pyrophosphoric acid, or mixed acids obtained by adding them with sulfuric acid, or potassium hydroxide can be used. The mask material in the wet etching can be selected depending on the substrate material and the etching liquid used. For example, in addition to silicon oxides such as $SiO_2$, an oxide(s) of at least one element selected from a group consisting of V, Zr, Nb, Hf, Ti, Ta and Al or a nitride(s) of at least one element selected from a group consisting of Si, B and Al can be used.

One embodiment of the method for manufacturing the sapphire substrate of embodiments of the present invention is described below with reference to FIGS. 6A-6D.

Firstly, a plurality of circular-shaped etching masks 16 are formed by forming $SiO_2$ layer 15 and the like on C-plane (0001) of the sapphire substrate 10 (FIG. 6A) followed by patterning (FIG. 6B). The orientation of the sapphire substrate surface 10 on which the etching masks 16 are formed, the shape, dimension and arrangement of the etching masks 16, the distance between the etching masks 16 and the like can be appropriately selected depending on the targeted number, shape and arrangement of a plurality of the projections.

Then, the etching of the sapphire substrate 10 is performed. Upon beginning the etching, a portion on which the etching masks 16 are not formed is removed by etching to form circular-shaped projections almost directly reflecting the shape of masks; however, the projections are affected by an anisotropy in etching rate derived from crystal orientation (a difference in the propagation rate of etching between different directions) with the propagation of etching and thus, the projections are formed into a shape reflecting the crystal orientation.

In particular, since the etching propagates with reflecting the crystal orientation due to the difference in etching rate between the propagating direction of the etching, three vertexes of the bottom and ridge lines of the triangular pyramid become gradually clear, so that the projections having substantially truncated triangular pyramidal-shape are formed under the circular-shaped etching masks 16. Upper surface of this substantially truncated triangular pyramidal-shaped projection is etched into substantially triangular shape and has an area less than the etching mask 16 due to an undercut. In addition, the bottom surface and the upper surface of the projection are formed into substantially triangular shape consisting of the respective sides having outwardly curved arc shape, and as the etching propagates, the areas (of the bottom surface and the upper surface) is reduced and the radius of curvature of the respective sides is increased to be rectilinear.

When the etching further propagates, the area of the upper surface of the projection becomes gradually decreased and at last, the projection has a shape such that the projection has a pointed top (FIG. 6C). After the projection has substantially triangular pyramidal-shape having a pointed top, the etching mask 16 is removed (FIG. 6D). Conditions for promoting the undercut effectively may be employed. For example, when a mixed acid comprising sulfuric acid and phosphoric acid is used as an etching solution, a ratio of phosphoric acid in the mixed acid may be increased. Specific composition of the mixed acid can be adjusted depending on a forming conditions of the etching mask and the like, and for example, a mixed acid with a mixing ratio of (sulfuric acid):(phosphoric acid)=3:2 can be used. Also, the undercut may be promoted effectively by reducing an adhesion between the etching mask and the sapphire substrate. The adhesion between the mask and the substrate can be reduced by adjusting the sputtering conditions of the mask.

In this way, the plurality of the projections 1 can be formed on the sapphire substrate 10 so that the projections have substantially pyramidal-shape with a pointed top and consist of the plurality of side surfaces, the side surfaces having the inclined angle of between 53 and 59° from the bottom surface of the projection. The specific etching conditions can be set depending on the shape of the targeted projections and the like.

It is also possible to form a projection 1 having triangular pyramidal-shape in which each side of the bottom surface is linear and each side surface is flat by increasing the etching time. Also, it is possible to form a projection 1 in which each side of the bottom surface has inwardly curved arc shape and each side surface is inwardly curved rounded surface. Furthermore, it is also possible to form a projection with a bottom surface having quadrangular shape, pentagonal shape, hexagonal shape or the like by using dry etching.

By the above-mentioned one-stage etching step, projections can be formed which have a substantially pyramidal-shape (for example, substantially triangular pyramidal-shape) constituted by a plurality of side surfaces to have a pointed top, wherein the side surfaces have an inclined angle of between 53° and 59° from a bottom surface of the projections, and wherein the inclined angle is substantially constant at any point on a line connecting the top of the projection with a center of a side of the bottom surface of the projection.

By forming the projections by wet etching, the resulting projection has a substantially triangular pyramidal-shape and the three side surfaces of this substantially triangular pyramidal-shape become close to R-plane. Therefore, the inclined angles of the respective side surfaces of the projection become close to the angle of R-plane. Specifically, the inclined angle is between 53° and 59°.

By the above-described method for manufacturing the sapphire substrate, the sapphire substrate which enables a growth of nitride semiconductor having excellent crystallinity can be obtained. By using the sapphire substrate, it can be obtained the nitride semiconductor light emitting element exhibiting excellent light extraction efficiency, especially from the side opposite to the sapphire substrate and from the direction perpendicular to the substrate.

[Nitride Semiconductor Light Emitting Element]

A structure of a nitride semiconductor light emitting element has a laminated structure formed by laminating a first conductive layer 22, an active layer 23, a second conductive layer 24 on the sapphire substrate 10 in this order as shown in, for example, FIG. 2. A first electrode and a second electrode are formed on the first conductive layer 22 exposed by removing a part of the active layer 23 and the second conductive layer 24 and on the second conductive layer 24, respectively, the second electrode consisting of a translucent ohmic electrode formed on approximately the whole surface of the second conductive electrode 24, and a pad and a diffusion electrode formed on the translucent ohmic electrode.

When the nitride semiconductor light emitting element of embodiments of the present invention is formed, gallium nitride-based compound semiconductor material represented by the general formula $In_xAl_yGa_{1-x-y}N$ ($0 \leq x \leq 1$, $0 \leq y \leq 1$, $0 \leq x+y \leq 1$) can be used as a semiconductor to be grown on the substrate, and in particular, its binary/ternary mixed crystal can be used preferably. Also, other semiconductor materials than the nitride semiconductor, such as GaAs, GaP-based compound semiconductor, AlGaAs, InAlGaP-based compound semiconductor can be used.

The light emitting element obtained in this manner is constituted by the nitride semiconductor having excellent crystallinity and has excellent light extraction efficiency, especially from the side opposite to the sapphire substrate and the direction perpendicular to the substrate.

EXAMPLE 1

Hereinafter, Examples with respect to embodiments of the present invention are described.

The projections were formed on a sapphire substrate by the following procedures.

A plurality of circular-shaped etching masks having diameters of about 1.5 μm were formed on each vertex of triangular lattice with a side of 1.9 μm by forming $SiO_2$ layer on a C-plane (0001) of the sapphire substrate and by patterning the $SiO_2$ layer. Subsequently, the substrate was immersed in an etching bath using a mixed acid of phosphoric acid and sulfuric acid as an etching liquid and etched with the solution temperature of about 290° C. for about 5 minutes. By this, a plurality of projections having substantially triangular pyramidal-shape with a pointed top were formed on the sapphire substrate. The inclined angle of the side surfaces constituting the projections was about 54°, the height of the projections was about 1.2 μm, the distance between the projections was 2.1 μm, and C-plane area ratio (area ratio of the crystal growth surface) was 35%. SEM image from the upper surface of the obtained sapphire substrate and the cross sectional SEM image are shown in FIG. 7B and FIG. 7B, respectively.

The distances between the projections were changed in the range from 1.9 to 3.1 μm, and for each of the distance between the projections, C-plane area ratios were changed in the range from 20 to 55% by adjusting the size of the etching masks, the length of a side of the triangular lattice and the time of etching.

Subsequently, the substrate was transferred into MOCVD (metalorganic chemical vapor deposition) apparatus, and the base layer 21 having flat surface was formed by growing GaN buffer layer of 20 nm at lower temperature (about 510° C.) on the substrate surface on which the projections were formed and on the buffer layer, growing along c-axis GaN at higher temperature (about 1050° C.).

On the base layer 21 obtained in this manner, the first conductive layer (n-type layer) 22 such as n-type contact layer, the active layer 23 and the second conductive layer (p-type layer) 24 were laminated in this order as shown in FIG. 2.

In particular, the n-type contact layer of Si ($4.5 \times 10^{18}$/cm$^3$)-doped GaN having thickness of 5 µm is formed on the base layer 21 as the first conductive layer (n-type layer) 22. Further, in the region between the n-type contact layer and the active layer, an undoped GaN layer of 0.3 µm, a Si ($4.5 \times 10^{18}$/cm$^3$)-doped GaN layer of 0.03 µm, an undoped GaN layer of 5 nm, a multilayer formed by repeatedly and alternatively laminating undoped $In_{0.1}Ga_{0.9}N$ layers of 2 nm and undoped GaN layers of 4 nm by 10 for each layer and at last laminating an undoped $In_{0.1}Ga_{0.9}N$ layer of 2 nm were laminated as the first conductive layer (n-type layer) 22. Then, a multiple quantum well structure formed by repeatedly and alternatively laminating undoped GaN barrier layers having thickness of 25 nm and $In_{0.3}Ga_{0.7}N$ well layers having thickness of 3 nm by 6 for each layer and at last laminating a barrier layer was laminated as the active layer 23 on the n-type layer 22. Then, a p-side multilayer formed by repeatedly and alternatively laminating Mg ($5 \times 10^{19}$/cm$^3$)-doped $Al_{0.15}Ga_{0.85}N$ layers having thickness of 4 nm and Mg ($5 \times 10^{19}$/cm$^3$)-doped $In_{0.03}Ga_{0.97}N$ layers having thickness of 2.5 nm by 5 for each layer and at last laminating the above-mentioned AlGaN layer and a p-type contact layer of Mg ($1 \times 10^{20}$/cm$^3$)-doped GaN having thickness of 0.12 µm were laminated as the second conductive layer (p-type layer) 24 on the active layer 23.

A part of the n-type layer 22 was exposed by removing a part of the nitride semiconductor layer from the p-type layer 24 by means of etching. The first electrode and the second electrode were formed on the exposed n-type layer 22 and on the p-type layer 24, respectively. In particular, ITO (about 170 nm) was formed as the translucent ohmic electrode on the surface of the p-type layer 24, which is the surface of the light emitting structure portion, and the electrode having a structure formed by laminating Rh (about 100 nm), Pt (about 200 nm) and Au (about 500 nm) in this order was formed on this ITO and on the n-type contact layer. In this manner, the nitride semiconductor light emitting element exhibiting an emission wavelength of 465 nm was manufactured.

COMPARATIVE EXAMPLE 1

Then, nitride semiconductor light emitting elements were prepared which were obtained by growing nitride semiconductor on sapphire substrates having substantially truncated triangular pyramidal-shaped projections formed thereon.

Firstly, projections having substantially truncated triangular pyramidal-shape were formed on C-plane of a sapphire substrate by procedures shown below.

Figure 8:
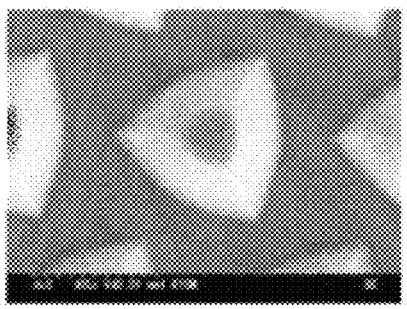
FIG. 8 is a SEM image from a top side of a sapphire substrate of Comparative Examples.

A plurality of circular-shaped etching masks having diameters of about 1.5 µm were formed on each vertex of triangular lattice with a side of 2.6 µm by forming $SiO_2$ layer on a C-plane (0001) of the sapphire substrate and by patterning the $SiO_2$ layer. Subsequently, the substrate was immersed in an etching bath using a mixed acid of phosphoric acid and sulfuric acid as an etching liquid and etched with the solution temperature of about 290° C. for about 4.5 minutes. By this, a plurality of projections having flat surfaces on the top were formed on the sapphire substrate. The inclined angle of the side surfaces constituting the projections was between about 53 and 59°, the height of the projections was about 1 µm, the distance between the projections was 3.5 µm, and C-plane area ratio was 60%. SEM image from the upper surface of the obtained sapphire substrate is shown in FIG. 8.

The distances between the adjacent projections were changed in the range from 1.9 to 3.1 µm, and for each of the distance between the projections, C-plane area ratios were changed in the range from 20 to 55% by adjusting the size of the etching masks, the length of a side of the triangular lattice and the time of etching as the above-described Example. In Comparative Examples, "distance between projections" means a distance between the centers of the bottom surface of the adjacent projections. Although C-plane area ratio in Comparative Examples is followed by the definition of crystal growth surface area ratio as described above, C-plane area in Comparative Examples is defined by the sum of the area of C-plane located between the adjacent projections and the area of flat surfaces formed on the top of projections.

Using the substrates obtained in this manner, nitride semiconductor light emitting elements of Comparative Example 1 were prepared by the similar procedures to those of the above-described Example 1.

[Measurement of Luminous Flux]

Bullet-shaped light emitting devices were prepared using the obtained light emitting elements of Example 1 and Comparative Example 1. In the bullet-shaped light emitting device, the light emitting element is placed on a first lead, and the first lead and a second lead are electrically connected to the light emitting element via wires. The first lead does not have a cup shape, and the light emitting device is placed on a flat surface of the first lead. A part of the first lead and a part of the second lead as well as the light emitting element is covered with epoxy resin and immobilized. A part of the epoxy resin hemispherical has hemispherical shape such that the light emitting element placed on the first lead is at the center.

Each of the prepared light emitting devices of Example 1 and Comparative Example 1 was placed at the center of a spherical integrating sphere, and the luminous flux $\Phi_v$ was determined.

For the light emitting devices of Example 1 and Comparative Example 1 which have the same distance between the projections and the C-plane area ratio, luminous flux ratio ($\Phi_v$ ratio) of the light emitting device of Example 1 to that of Comparative Example 1 is defined by the following formula (1).

$$\text{Luminous flux ratio } (\phi_v \text{ ratio})(a.u.) = \frac{\text{Luminous flux of light emitting device of Example}}{\text{Luminous flux of light emitting device of Comparative Example}} \quad \text{[Formula 1]}$$

Figure 9:
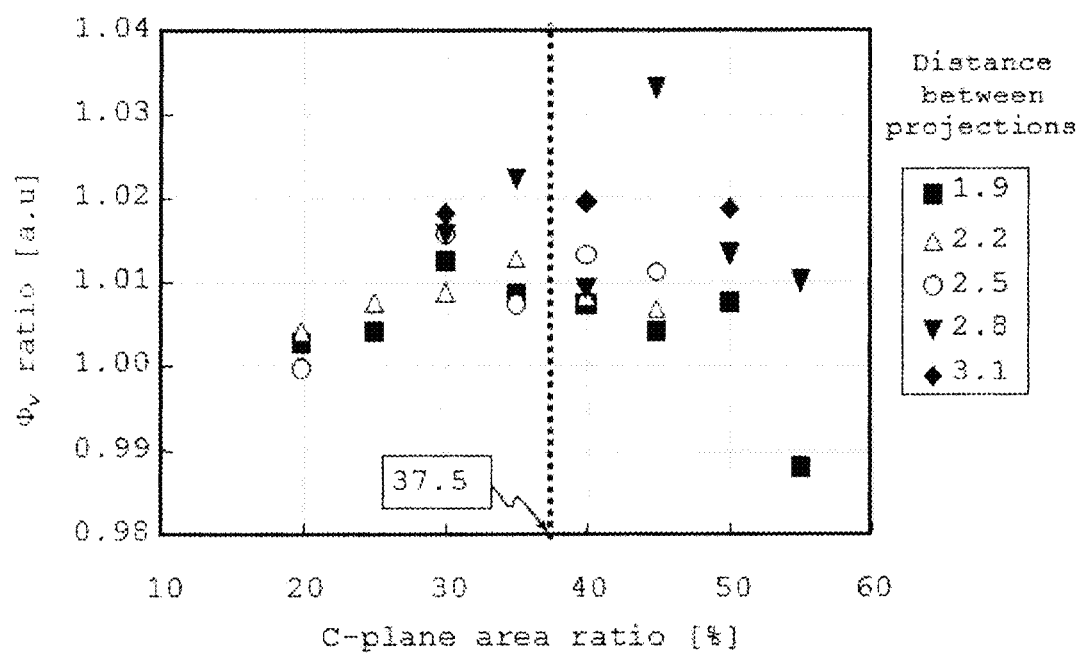
FIG. 9 is a graph showing a luminous flux ratio of a light emitting device of Example 1 to that of Comparative Example 1.

For each of the light emitting devices of Example 1 and Comparative Example 1 which have the same distance between the projections and the C-plane area ratio, the amount of luminous flux ratio was calculated using the formula (1). FIG. 9 shows a graph plotting the obtained luminous flux to the C-plane area ratio.

As can be seen from FIG. 9, the luminous flux ratio ($\Phi_v$ ratio) of the light emitting devices of Example 1 to those of Comparative Example tends to be more than 1. By this, the light emitting devices of Example 1 were found to exhibit increased luminous flux and thus, improved light extraction efficiency compared to the light emitting device of Comparative Example 1. The luminous flux ratio tends to be increased with the increased distance between the projections, and particularly large value of the luminous flux ratio was obtained when the distance between the projections was between 2.2 and 3.1 μm, and in particular between 2.8 and 3.1 μm. In addition, for any distances between the projection, particularly large value of luminous flux ratio was obtained when C-plane area ratio was between 25 and 50%, and in particular between 30 and 45%.

EXAMPLE 2

Then, nitride semiconductor light emitting elements of Example 2 and Comparative Example 2 were prepared which had the distance between the projections of between 1.9 and 3.1 μm and C-plane area ratio of between about 35% and 70% by the similar procedures to those explained in Example 1 and Comparative Example 1 described above. These nitride semiconductor light emitting elements of Example 2 and Comparative Example 2 have the same constitution as those of Example 1 and Comparative Example 1 described above except that the distance between the projections was between 1.9 and 3.1 μm and C-plane area ratio was between about 35% and 70%.

[Measurement of Luminous Flux]

Bullet-shaped light emitting devices were prepared using the obtained light emitting elements of Example 2 and Comparative Example 2, similarly to Example 1 and Comparative Example 1 described above. Each of the prepared light emitting devices of Example 2 and Comparative Example 2 was placed at the center of a spherical integrating sphere, and the radiant flux $\Phi_e$ and the luminous flux $\Phi_v$ in all directions were determined.

For the nitride semiconductor light emitting elements of Example 2 and Comparative Example 2 which had the same distance between the projections and C-plane area ratio, the luminous flux ratio ($\Phi_v$ ratio) of the nitride semiconductor light emitting element of Example 2 to that of Comparative Example 2 is defined by the formula (1) described above, and the radiant flux ratio ($\Phi_e$ ratio) of the nitride semiconductor light emitting element of Example 2 to that of Comparative Example 2 is defined by the following formula (2).

$$\text{Radiant flux ratio } (\phi_e \text{ ratio})(a.u.) = \frac{\text{Radiant flux of light emitting device of Example}}{\text{Radiant flux of light emitting device of Comparative Example}} \quad \text{[Formula 2]}$$

Figure 10:
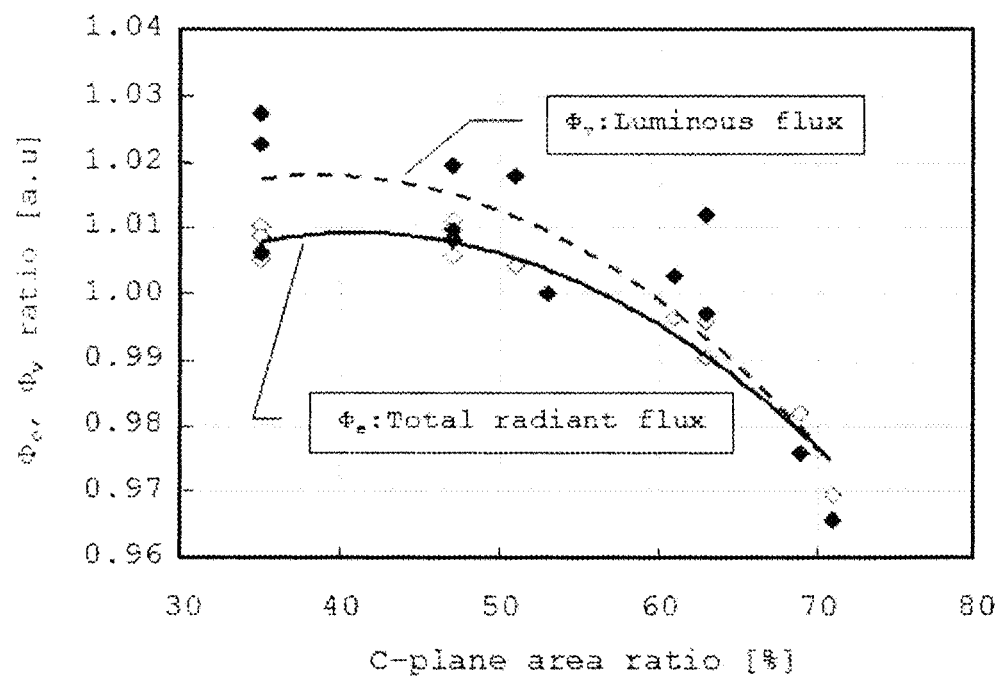
FIG. 10 is a graph showing a radiant flux ratio and a luminous flux ratio of a light emitting device of Example 2 to that of Comparative Example 2.

The luminous flux ratios and the radiant flux ratios were calculated using the formulas (1) and (2) for each of the light emitting devices of Example 2 and Comparative Example 2. FIG. 10 shows a graph plotting the obtained radiant flux ratios and the luminous flux ratios to the C-plane area ratio.

As can be seen from FIG. 10, radiant flux ratio ($\Phi_e$ ratio) and luminous flux ratio ($\Phi_v$ ratio) both tend to be more than 1 when C-plane area ratio is about 60% or less, and particularly increased radiant flux ratio and luminous flux ratio were achieved when C-plane area ratio was between 25 and 50%, particularly between 30 and 45%. By this, it is found that the light emitting device of Example 2 according to the present invention has increased luminous flux compared to the light emitting device of Comparative Example 2, and thus, has improved light extraction efficiency.

In addition, as can be seen from FIG. 10, the value of the luminous flux ratio tends to be larger than that of the radiant flux ratio when the C-plane area ratio is in the range between about 35% and 70%. This tendency was significant when the C-plane area ratio was between 25 and 50%, in particular between 30 and 45%. By this, the light emitting device of Example 2 was found to have excellent light emitting efficiency compared to the light emitting device of Comparative Example 2.

EXAMPLE 3

A nitride semiconductor light emitting elements of Example 3 which had the distance between the projections of 2.5 μm and C-plane area ratio of 51% was prepared by the similar procedures to those of the above-described Example 1. This nitride semiconductor light emitting elements of Example 3 had the same configuration as that of Example 1 except that the distance between the projections was 2.5 μm and C-plane area ratio was 51%.

COMPARATIVE EXAMPLE 3

As a nitride semiconductor light emitting element of Comparative Example 3, a nitride semiconductor light emitting element was prepared which was obtained by growing a nitride semiconductor on a sapphire substrate, wherein the projections having a substantially triangular pyramidal-shape were formed, and wherein the inclined angle of side surfaces of the projections varies in two stage.

Firstly, projections were formed on C-plane of a sapphire substrate by procedures shown below.

Figure 11:
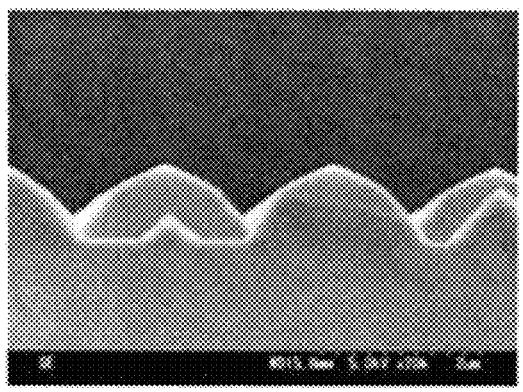
FIG. 11 is a SEM image at a cross section of the projections of Comparative Example 3.

A plurality of circular-shaped etching masks having diameters of about 1.5 μm were formed on each vertex of triangular lattice with a side of 2.5 μm by forming SiO₂ layer on a C-plane (0001) of the sapphire substrate and by patterning the SiO₂ layer. Subsequently, the substrate was immersed in an etching bath using a mixed acid with reduced mixing ratio of phosphoric acid compared to the mixed acid used in Example 1 (specifically, sulfuric acid:phosphoric acid=3:1) as an etching liquid and etched with the solution temperature of about 290° C. for about 4.5 minutes. And then, the etching masks were removed, the substrate was immersed again in the etching bath described above and etched with the solution temperature of about 290° C. for about 1 minute. By this, substantially triangular pyramidal-shaped projections in which the inclined angle of the side surface varies in two stage were formed on the substrate. The inclined angle of the side surfaces constituting the projections was 53° on the lower side and 28° on the upper side. The height of the projections was about 1 μm, the distance between the projections was 2.5 μm, and C-plane area ratio was 38%. Cross-sectional SEM image of the obtained sapphire substrate is shown in FIG. 11. From FIG. 11, it is found that the inclined angle of the side surface varies in two stage at the cross-section passing through the top of the projection. Using the substrate obtained in this manner, a nitride semiconductor light emitting element of Comparative Example 3 was prepared by similar procedures to those of Example 1 described above.

Figure 12A:
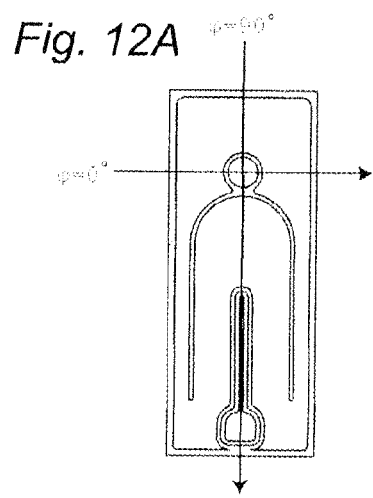
FIG. 12A is a top view of the nitride semiconductor light emitting elements of Example 3 and Comparative Example 3.
Figure 12B:
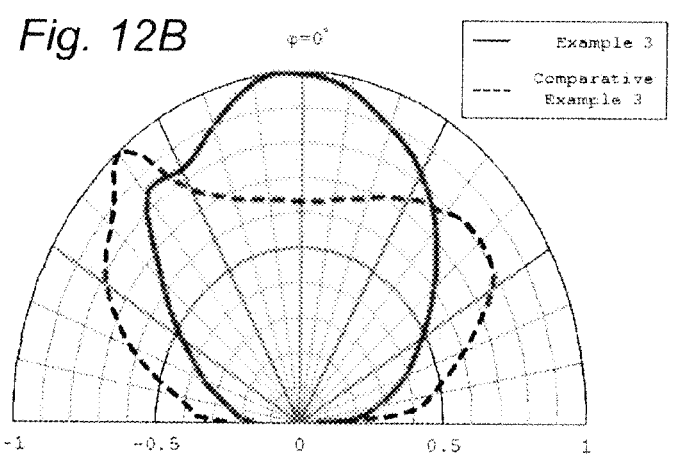
FIG. 12B shows a directional characteristics of the nitride semiconductor light emitting elements of Example 3 and Comparative Example 3 when the light intensities were measured in a direction of $\phi=0°$.
Figure 12C:
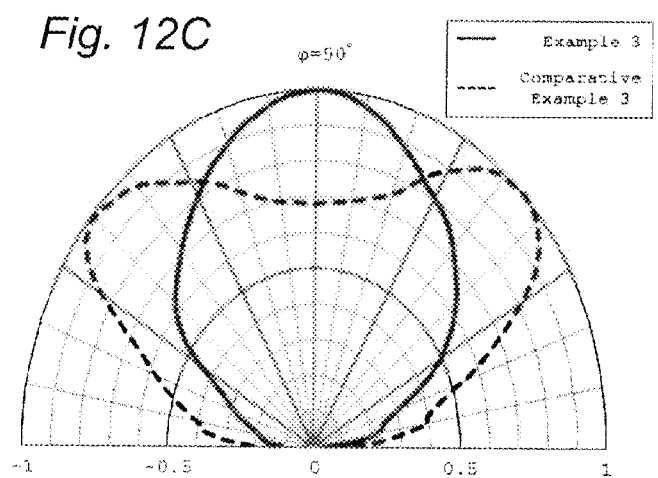
FIG. 12C shows a directional characteristics of the nitride semiconductor light emitting elements of Example 3 and Comparative Example 3 when the light intensities were measured in a direction of $\phi=90°$.

For each of the nitride semiconductor light emitting elements of Example 3 and Comparative Example 3 obtained in this manner, the light intensities were measured and the directional characteristics were evaluated. The results are shown in FIG. 12. FIG. 12A is a top view of the nitride semiconductor light emitting elements of Example 3 and Comparative Example 3. FIG. 12B is a graph showing the directional characteristics of the nitride semiconductor light emitting elements of Example 3 and Comparative Example 3 when the light intensities were measured in a direction of $\phi=0°$ shown in FIG. 12A, and FIG. 12C is a graph showing the directional characteristics of the nitride semiconductor light emitting elements of Example 3 and Comparative Example 3 when the light intensities were measured in a direction of $\phi=90°$ shown in FIG. 12A. In FIG. 12B and FIG. 12C, the radial direction indicates the light intensity and the circumferential direction indicates the directivity angle. The light intensities are shown as relative values based on the maximum light intensity in each of the nitride semiconductor light emitting elements.

From FIGS. 12A, 12B, and 12C, it was found that the nitride semiconductor light emitting element of Example 3 in which the projections have the constant inclined angle exhibited improved light extraction efficiency to the front direction of the nitride semiconductor light emitting element, compared to the nitride semiconductor light emitting element of Comparative Example 3 in which the projections have the inclined angle varying in two stage, in any case of $\phi=0°$ and $\phi=90°$.

The sapphire substrate of embodiments of the present invention can provide a nitride semiconductor light emitting element having high output and light extraction efficiency.

What is claimed is:

1. A sapphire substrate provided with a plurality of projections on a principal surface on which a nitride semiconductor is grown to form a nitride semiconductor light emitting element, wherein the projections have a substantially triangular pyramidal-shape the projections having a plurality of side surfaces and a pointed top, wherein the side surfaces have an inclination angle of between 53° and 59° from a bottom of the projections, and wherein the side surfaces are crystal-growth-suppressed surfaces on which a growth of the nitride semiconductor is suppressed relative to a portion of the principal surface located between adjacent projections, wherein a bottom of the projections has a substantially triangular shape having three outwardly curved arc-shaped sides, and each of the side surfaces has a substantially triangular shape having vertexes located at the top of the projection and at both ends of a respective side of the bottom of the projection, and wherein the projections are arranged on vertexes of a triangular lattice, and an orientation of the bottom of said projections conforms with an orientation that is rotated by about 30 degrees from an orientation of a triangle of the triangular lattice.

2. The sapphire substrate according to claim 1, wherein the projections have a height of between 1.0 and 1.7 µm.

3. The sapphire substrate according to claim 1, wherein the projections are separated from each other on the principal surface of the sapphire substrate.

4. The sapphire substrate according to claim 1, wherein the projections are arranged periodically on the principal surface of the sapphire substrate.

5. The sapphire substrate according to claim 1, wherein a distance between tops of the adjacent projections is between 2.2 µm and 3.1 µm.

6. The sapphire substrate according to claim 5, wherein the distance between tops of the adjacent projections is between 2.8 µm and 3.1 µm.

7. The sapphire substrate according to claim 1, wherein the portion of the principal surface located between the adjacent projections is a crystal growth surface, and wherein a ratio of an area of the crystal growth surface to an area of the principal surface is between 25% and 60%.

8. The sapphire substrate according to claim 7, wherein the ratio of the area of the crystal growth surface to that of the principal surface is between 30% and 45%.

* * * * *